United States Patent
Jangjian et al.

(10) Patent No.: US 9,620,610 B1
(45) Date of Patent: Apr. 11, 2017

(54) FINFET GATE STRUCTURE AND METHOD FOR FABRICATING THE SAME

(71) Applicant: TAIWAN SEMICONDUCTOR MANUFACTURING CO., LTD., Hsinchu (TW)

(72) Inventors: Shiu-Ko Jangjian, Tainan (TW); Chi-Cheng Hung, Tainan (TW); Chi-Wen Liu, Hsinchu (TW); Horng-Huei Tseng, Hsinchu (TW)

(73) Assignee: Taiwan Semiconductor Manufacturing Co., LTD., Hsin-chu (TW)

( * ) Notice: Subject to any disclaimer, the term of this patent is extended or adjusted under 35 U.S.C. 154(b) by 0 days.

(21) Appl. No.: 14/983,422

(22) Filed: Dec. 29, 2015

Related U.S. Application Data

(60) Provisional application No. 62/247,480, filed on Oct. 28, 2015.

(51) Int. Cl.
*H01L 29/49* (2006.01)
*H01L 27/092* (2006.01)
*H01L 21/8238* (2006.01)

(52) U.S. Cl.
CPC .. *H01L 29/4966* (2013.01); *H01L 21/823821* (2013.01); *H01L 27/0924* (2013.01)

(58) Field of Classification Search
CPC ............................................. H01L 27/823821
USPC .......................................... 257/369; 438/156
See application file for complete search history.

(56) References Cited

U.S. PATENT DOCUMENTS

| | | | | |
|---|---|---|---|---|
| 8,647,972 B1* | 2/2014 | Ando | ................ | H01L 21/28088 257/E21.294 |
| 2013/0277686 A1* | 10/2013 | Liu | ..................... | H01L 29/6653 257/77 |
| 2014/0167187 A1* | 6/2014 | Kuo | ..................... | H01L 29/4966 257/411 |
| 2014/0306273 A1 | 10/2014 | Ho et al. | | |
| 2015/0270177 A1 | 9/2015 | Tseng et al. | | |
| 2015/0279680 A1* | 10/2015 | Kashefi | ............. | H01L 21/28088 438/592 |
| 2016/0093535 A1* | 3/2016 | Xu | ..................... | H01L 21/02244 257/392 |
| 2016/0163799 A1* | 6/2016 | Kim | ..................... | H01L 29/1083 257/203 |

FOREIGN PATENT DOCUMENTS

DE    195 15 564 A1    11/1995

* cited by examiner

*Primary Examiner* — Dung Le
(74) *Attorney, Agent, or Firm* — Cooper Legal Group, LLC

(57) ABSTRACT

A semiconductor device includes a n-type gate structure over a first semiconductor fin, in which the n-type gate structure includes a n-type work function metal layer overlying the first high-k dielectric layer. The n-type work function metal layer includes a TiAl (titanium aluminum) alloy, in which an atom ratio of Ti (titanium) to Al (aluminum) is in a range substantially from 1 to 3. The semiconductor device further includes a p-type gate structure over a second semiconductor fin, in which the p-type gate structure includes a p-type work function metal layer overlying the second high-k dielectric layer. The p-type work function metal layer includes titanium nitride (TiN), in which an atom ratio of Ti to N (nitrogen) is in a range substantially from 1:0.9 to 1:1.1.

19 Claims, 11 Drawing Sheets

FINFET GATE STRUCTURE AND METHOD FOR FABRICATING THE SAME

RELATED APPLICATIONS

This application claims priority to U.S. Provisional Application Ser. No. 62/247,480, filed Oct. 28, 2015, which is herein incorporated by reference.

BACKGROUND

The semiconductor integrated circuit (IC) industry has experienced rapid growth. In the course of the IC evolution, functional density (defined as the number of interconnected devices per chip area) has generally increased while geometry size (i.e., the smallest component (or line) that can be created using a fabrication process) has decreased. A scaling down process generally provides benefits by increasing production efficiency and lowering associated costs. But, such scaling down has increased the complexity of processing and manufacturing ICs. For these advances to be realized, similar developments in IC manufacturing are needed.

As the semiconductor IC industry has progressed into nanometer technology process nodes in pursuit of higher device density, higher performance, and lower costs, challenges from both fabrication and design have resulted in the development of three-dimensional (3D) devices such fin-like field effect transistors (FinFETs). Advantages of FinFET devices include reducing the short channel effect and higher current flow. There has been a desire to use a FinFET device with a high-k gate dielectric and metal gate electrode to improve device performance as feature sizes continue to decrease. A n-type MOS (NMOS) device and a p-type MOS (PMOS) device require different work functions for their respective gate structures. Conventional FinFET devices with high-k metal gates and methods of fabricating the FinFET devices have not been entirely satisfactory in all respects, especially for fabricating a NMOS device together with a PMOS device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
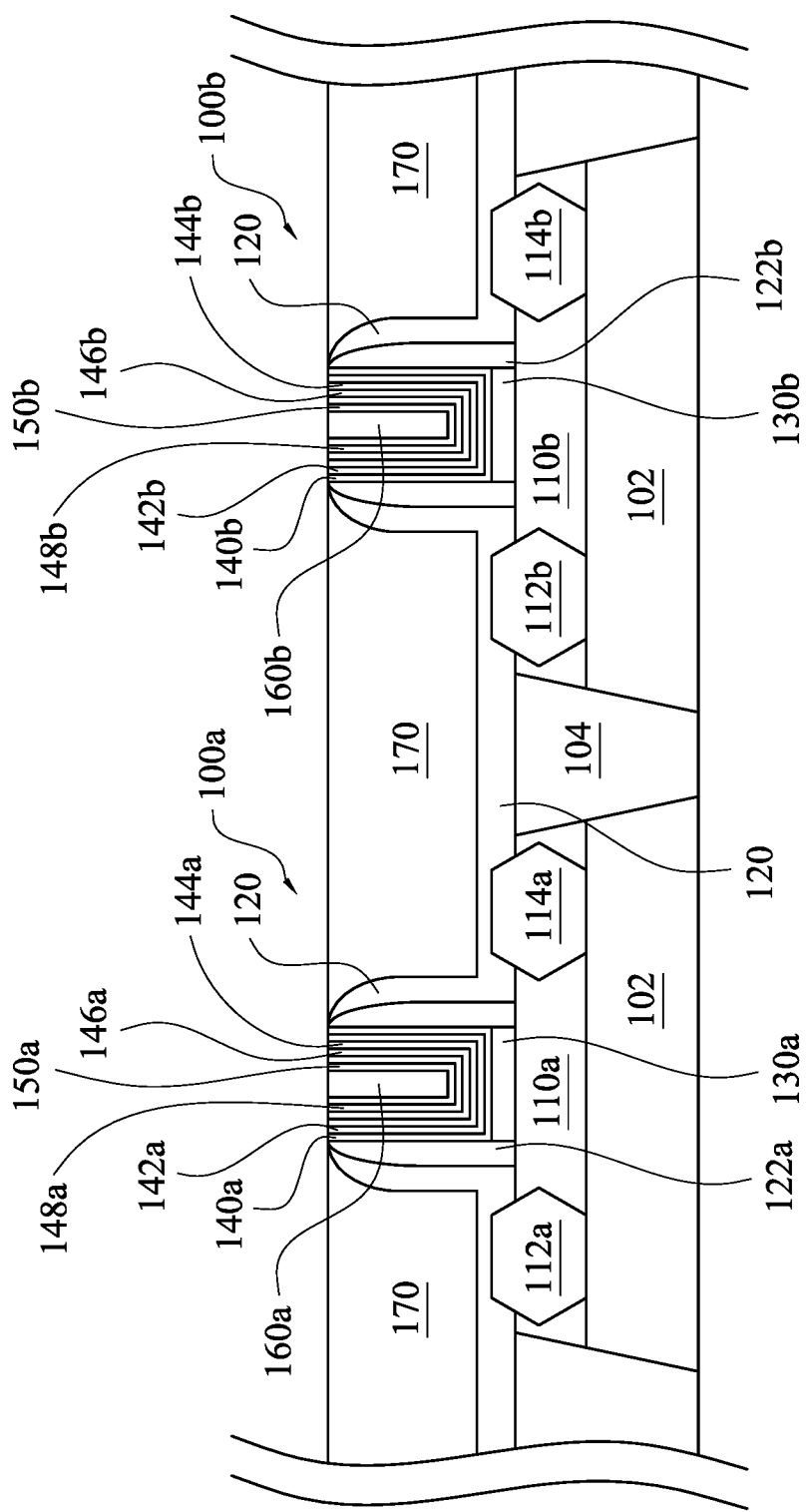
FIG. 1 is a schematic cross-sectional view of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. In addition, the present disclosure may repeat reference numerals and/or letters in the various examples. This repetition is for the purpose of simplicity and clarity and does not in itself dictate a relationship between the various embodiments and/or configurations discussed. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

It will be understood that, although the terms "first", "second", "third", etc., may be used in the claims to describe various elements, these elements should not be limited by these terms, and these elements correspondingly described in the embodiments are presented by different reference numbers. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Embodiments of the present disclosure are directed to a semiconductor device on which a PMOS FinFET device and a NMOS FinFET device with metal gate structures are simultaneously formed, thereby simplifying the fabrication process. From an EDS (Energy dispersive spectroscopy) analysis, the NMOS FinFET device includes a n-type work function metal layer. The n-type work function metal layer includes a TiAl (titanium aluminum) alloy, in which an atom ratio of Ti (titanium) to Al (aluminum) is in a range substantially from 1 to 3, and both surfaces of the n-type work function metal layer contains an oxygen concentration substantially less than 10 atom percent (at %). The PMOS FinFET device includes a p-type work function metal layer overlying the second high-k dielectric layer. The p-type work function metal layer includes titanium nitride (TiN), in which an atom ratio of Ti to N (nitrogen) is in a range substantially from 1:0.9 to 1:1.1, and the p-type work function metal layer contains an oxygen concentration less than 10 atom percent (at %). Oxygen can cause a shift in the work function of the work function metal layer 146b, and thus the less oxygen concentration can lead to the better quality of the work function metal layer. Therefore, embodiments of the present disclosure provide work function metal layers with excellent properties.

Referring to FIG. 1, FIG. 1 is a schematic cross-sectional diagram of a semiconductor device in accordance with some embodiments of the present disclosure. The semiconductor device includes a semiconductor substrate 102, a semiconductor fin 110a, a second semiconductor fin 110b, a n-type gate structure 100a and a p-type gate structure 100b. The semiconductor fin 110a and the semiconductor fin 110b are disposed on the semiconductor substrate 102, and separated by an isolation structure 104. In some embodiments, the isolation structure 104 is a shallow trench isolation (STI). The semiconductor substrate 102 is defined as any construction including semiconductor materials, including, but is not limited to, bulk silicon, a semiconductor wafer, or a silicon germanium substrate. Other semiconductor materials including group III, group IV, and group V elements may also be used. The semiconductor fins 110a and 110b protrude from the semiconductor substrate 102. A gate spacer 122a is formed on sidewalls of the n-type gate structure 100a, and a gate spacer 122b is formed on sidewalls of the p-type gate structure 100b. The gate spacer 122a, and the gate spacer 122b may include silicon oxide, silicon nitride, silicon oxynitride, or other dielectric material. Source/drain portions 112a and 114a are disposed on the semiconductor fin 110a adjacent to both sides of the gate spacer 122a, and thus the source/drain portions 112a and 114a together with the n-type gate structure 100a forms a NMOS FinFET device. Source/drain portions 112b and 114b are disposed on the semiconductor fin 110b adjacent to both sides of the gate spacer 122b, and thus the source/drain portions 112b and 114b together with the p-type gate structure 100b forms a PMOS FinFET device. In some examples, the source/drain portions 112a and 114a include SiP, and the source/drain portions 112b and 114b include SiGe.

In some embodiments, an etching stop layer 120 overlies the gate spacer 122a, the source/drain portions 112a and 114a, the isolation structure 104, the gate spacer 122b, and the source/drain portions 112b and 114b. An inter-layer dielectric (ILD) 170 overlies the etching stop layer 120. The ILD 170 may include silicon oxide, phosphosilicate glass (PSG), borophosphosilicate glass (BPSG), and the like.

The n-type gate structure 100a includes an initial layer 130a, a high-k dielectric layer 140a, a capping metal layer 142a, a barrier metal layer 144a, a TiN layer 146a, a n-type work function metal layer 148a, a blocking metal layer 150a, and a metal filler 160a. The initial layer 130a is disposed over the semiconductor fin 110a. In some examples, the initial layer 130a includes a silicon oxide layer. The high-k dielectric layer 140a is disposed over the initial layer 130a, and is enclosed by the gate spacer 122a. The high-k dielectric layer 140a may have a thickness ranging from about 10 angstroms to about 20 angstroms. In some embodiments, the high-k dielectric layer 140a may include a high-k dielectric such as hafnium oxide (HfO$_2$) hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or combinations thereof.

The capping metal layer 142a overlies the high-k dielectric layer 140a, and is disposed between the high-k dielectric layer 140a and the n-type work function metal layer 148a. The capping metal layer 142a includes TiN, and may have a thickness ranging from about 10 angstroms to about 30 angstroms. The barrier metal layer 144a overlies the capping metal layer 142a, and is disposed between the capping metal layer 142a and the n-type work function metal layer 148a. The barrier metal layer 144a includes TaN (tantalum nitride) and may have a thickness ranging from about 10 angstroms to about 30 angstroms. The TiN layer 146a overlies the barrier metal layer 144a, and is disposed between the barrier metal layer 144a and the n-type work function metal layer 148a, and may have a thickness ranging from about 5 angstroms to about 20 angstroms. The capping metal layer 142a, the barrier metal layer 144a, and the TiN layer 146a are used to prevent impurities from entering underlying layers. In certain embodiments, only one or more of the capping metal layer 142a, the barrier metal layer 144a, and the TiN layer 146a is disposed between the high-k dielectric layer 140a and the n-type work function metal layer 148a. It is noted that the sequence of the capping metal layer 142a, the barrier metal layer 144a, and the TiN layer 146a may be changed without affecting their purposes.

The n-type work function metal layer 148a overlies the TiN layer 146a and the high-k dielectric layer 140a, and may have a thickness ranging from about 30 angstroms to about 100 angstroms. The n-type work function metal layer 148a includes a TiAl (titanium aluminum) alloy, in which both surfaces of the n-type work function metal layer 148a adjoin the TiN layer 146a and the blocking metal layer 150a respectively. From a result of EDS line scan, an atom ratio of Ti (titanium) to Al (aluminum) is in a range substantially from 1 to 3, and the both surfaces of the n-type work function metal layer 148a contains an oxygen concentration less than about 10 atom percent (at %), and Al atom concentrations near or at the both surfaces of the n-type work function metal layer 148a are higher than Al atom concentrations at other portions of the n-type work function metal layer 148a, i.e. more Al segregation near or at the both surfaces of the n-type work function metal layer 148a, thereby providing the work function metal layer with excellent properties. Oxygen can cause a shift in the work function of the n-type work function metal layer 148a, and thus the less oxygen concentration can lead to the better quality of the n-type work function metal layer 148a.

The blocking metal layer 150a overlies the n-type work function metal layer 148a for protecting the n-type work function metal layer 148a, in which the blocking metal layer 150a includes TiN, and may have a thickness ranging from about 10 angstroms to about 30 angstroms. The metal filler 160a fills a trench (not labeled) peripherally enclosed by the blocking metal layer 150a, and may have a thickness ranging from about 1000 angstroms to about 5000 angstroms. The metal filler 160a can be configured to provide an electrical transmission. In some embodiments, the metal filler 160a may be formed from materials such as tungsten, copper or other suitable materials, and/or combinations thereof.

The p-type gate structure 100b includes an initial layer 130b, a high-k dielectric layer 140b, a capping metal layer 142b, a barrier metal layer 144b, a p-type work function metal layer 146b, a TiAl layer 148b a blocking metal layer 150b, and a metal filler 160b. The initial layer 130b is disposed over the semiconductor fin 110b. In some examples, the initial layer 130b includes a silicon oxide layer. The high-k dielectric layer 140b is disposed over the initial layer 130b, and is enclosed by the gate spacer 122b. The high-k dielectric layer 140b may have a thickness ranging from about 10 angstroms to about 20 angstroms. In some embodiments, the high-k dielectric layer 140a may include a high-k dielectric such as hafnium oxide (HfO$_2$) hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or combinations thereof.

The capping metal layer 142b overlies the high-k dielectric layer 140b, and is disposed between the high-k dielectric layer 140b and the p-type work function metal layer 146b. The capping metal layer 142b includes TiN, and may have a thickness ranging from about 10 angstroms to about 30 angstroms. The barrier metal layer 144b overlies the capping metal layer 142b, and is disposed between the capping metal layer 142b and the p-type work function metal layer 146b. The barrier metal layer 144b includes TaN (tantalum nitride) and may have a thickness ranging from about 10 angstroms to about 30 angstroms. The capping metal layer 142b and the barrier metal layer 144b are used to prevent impurities from entering underlying layers. In certain embodiments, only one or more of the capping metal layer 142b and the barrier metal layer 144b is disposed between the high-k dielectric layer 140b and the p-type work function metal layer 146b. It is noted that the sequence of the capping metal layer 142b and the barrier metal layer 144b may be changed without affecting their purposes.

The p-type work function metal layer 146b overlies the barrier metal layer 144b, and may have a thickness ranging from about 5 angstroms to about 20 angstroms. The p-type work function metal layer 146b includes TiN, in which from a result of EDS line scan, an atom ratio of Ti to N (nitrogen) is in a range substantially from 1:0.9 to 1:1.1, and the p-type work function metal layer 146b contains an oxygen concentration less than about 10 atom percent (at %), thereby providing the work function metal layer with excellent properties. Oxygen can cause a shift in the work function of the p-type work function metal layer 146b, and thus the less oxygen concentration can lead to the better quality of the p-type work function metal layer 146b.

The TiAl layer 148b overlies the p-type work function metal layer 146b, and is disposed between the p-type work function metal layer 146b and the blocking metal layer 150b, and may have a thickness ranging from about 30 angstroms to about 100 angstroms. The blocking metal layer 150b overlies the TiAl layer 148b for protecting the TiAl layer 148b and the p-type work function metal layer 146b, in which the blocking metal layer 150b includes TiN, and may have a thickness ranging from about 10 angstroms to about 30 angstroms. The metal filler 160b fills a trench (not labeled) peripherally enclosed by the blocking metal layer 150b, and may have a thickness ranging from about 1000 angstroms to about 5000 angstroms. The metal filler 160b can be configured to provide an electrical transmission. In some embodiments, the metal filler 160b may be formed from materials such as tungsten, copper or other suitable materials, and/or combinations thereof.

The aforementioned high-k dielectric layers 140a and 140b may be formed from one identical layer; the aforementioned capping metal layers 142a and 142b may be formed from one identical layer; the aforementioned barrier metal layers 144a and 144b may be formed from one identical layer; the aforementioned TiN layer 146a and p-type work function metal layer 146b may be formed from one identical layer; the aforementioned n-type work function metal layer 148a and TiAl layer 148b may be formed from one identical layer; the aforementioned blocking metal layers 150a and 150b may be formed from one identical layer; and the aforementioned metal fillers 160a and 160b may be formed from one identical layer.

Figure 2A:
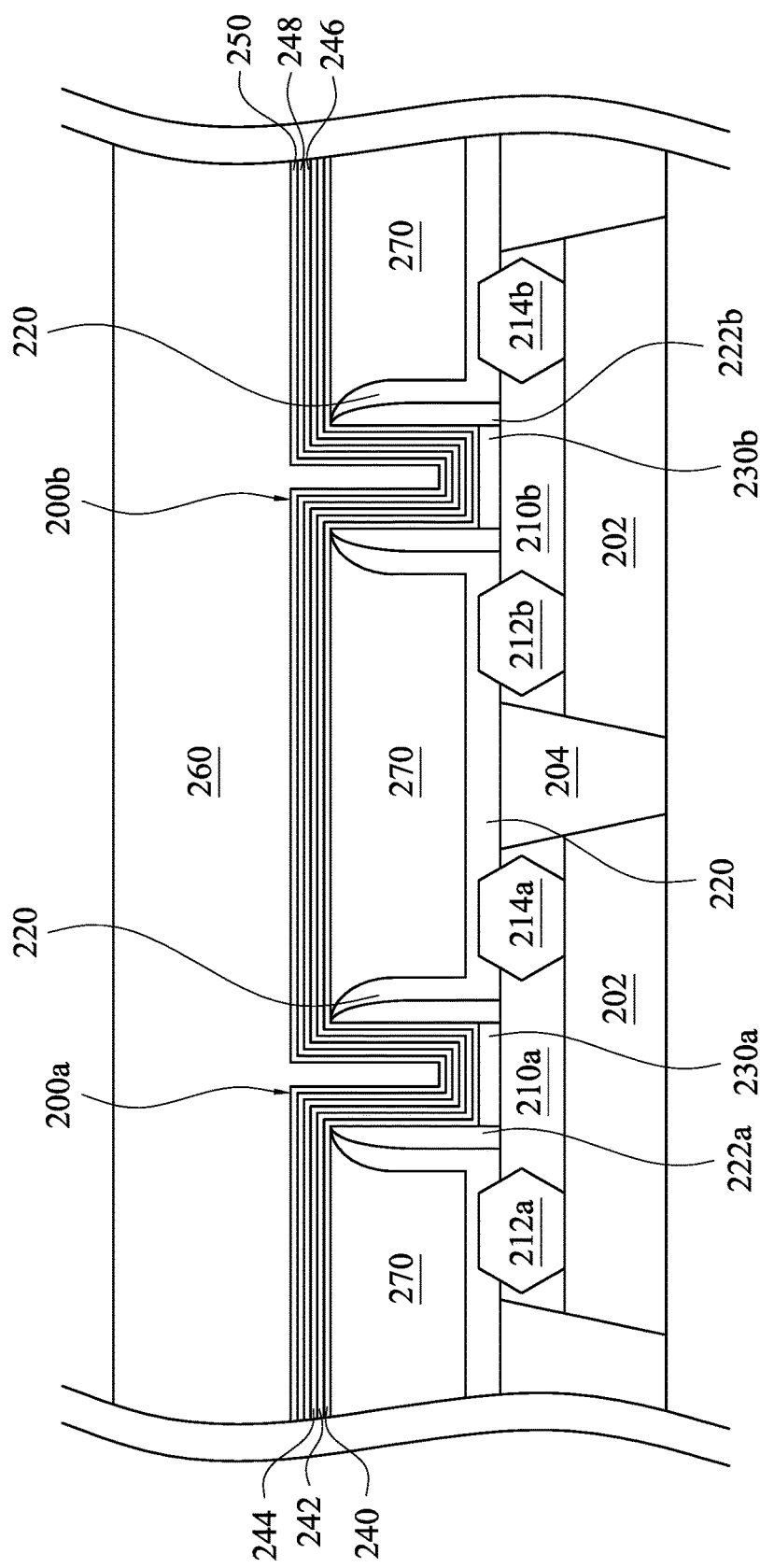
FIG. 2A and FIG. 2B are schematic cross-sectional views of a semiconductor device in accordance with certain embodiments of the present disclosure.
Figure 2B:
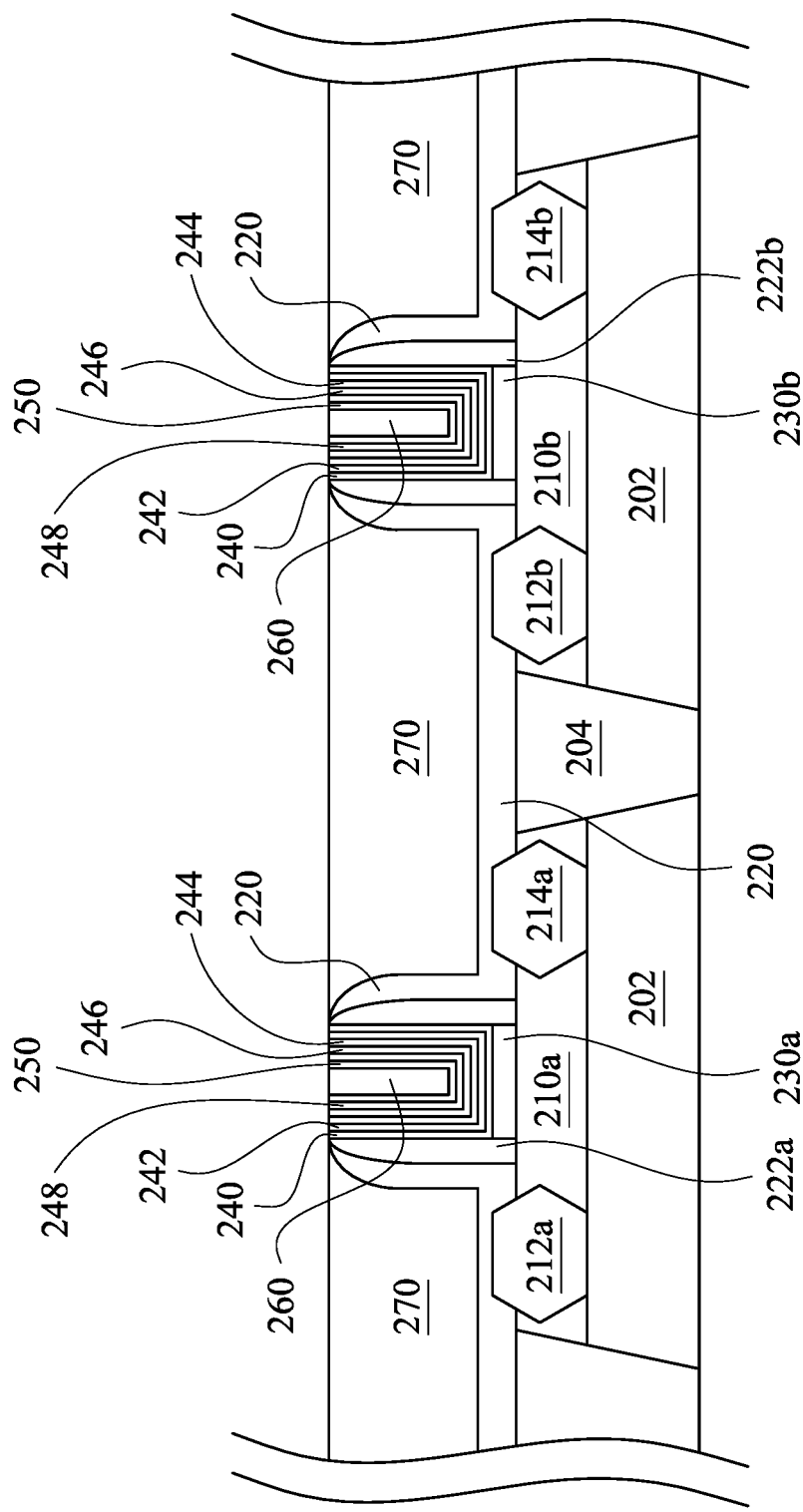

Referring to FIG. 2A and FIG. 2B, FIG. 2A and FIG. 2B are schematic cross-sectional views of a semiconductor device in accordance with certain embodiments of the present disclosure. The semiconductor device includes a semiconductor substrate 202, a semiconductor fin 210a, a second semiconductor fin 210b, a n-type gate structure 200a and a p-type gate structure 200b. The semiconductor fin 210a and the semiconductor fin 210b are disposed on the semiconductor substrate 202, and separated by an isolation structure 204. In some embodiments, the isolation structure 204 is a shallow trench isolation (STI). The semiconductor substrate 202 is defined as any construction including semiconductor materials, including, but is not limited to, bulk silicon, a semiconductor wafer, or a silicon germanium substrate. Other semiconductor materials including group III, group IV, and group V elements may also be used. The semiconductor fins 210a and 210b protrude from the semiconductor substrate 202. A gate spacer 222a is formed on sidewalls of the n-type gate structure 200a, and a gate spacer 222b is formed on sidewalls of the p-type gate structure 200b. The gate spacer 222a, and the gate spacer 222b may include silicon oxide, silicon nitride, silicon oxynitride, or other dielectric material. Source/drain portions 212a and 214a are disposed on the semiconductor fin 210a adjacent to both sides of the gate spacer 222a, and thus the source/drain portions 212a and 214a together with the n-type gate structure 200a forms a NMOS FinFET device. Source/drain portions 212b and 214b are disposed on the semiconductor fin 210b adjacent to both sides of the gate spacer 222b, and thus the source/drain portions 212b and 214b together with the p-type gate structure 200b forms a PMOS FinFET device. In some examples, the source/drain portions 212a and 214a include SiP, and the source/drain portions 212b and 214b include SiGe.

In some embodiments, an etching stop layer 220 overlies the gate spacer 222a, the source/drain portions 212a and 214a, the isolation structure 204, the gate spacer 222b, and the source/drain portions 212b and 214b. An inter-layer dielectric (ILD) 270 overlies the etching stop layer 220. The ILD 270 may include silicon oxide, phosphosilicate glass (PSG), borophosphosilicate glass (BPSG), and the like.

The n-type gate structure 200a includes an initial layer 230a enclosed by a gate spacer 222a, and the p-type gate structure 200b includes an initial layer 230b enclosed by a gate spacer 222b. Each of the n-type gate structure 200a and the p-type gate structure 200b includes an initial layer 230a, a high-k dielectric layer 240, a TiN layer 242, a TaN layer 244, a TiN layer 246, a TiAl layer 248, a TiN layer 250, and a metal filler 260. The initial layer 230a is disposed over the semiconductor fin 210a, and the initial layer 230b is disposed over the semiconductor fin 210b. In some examples, each of the initial layer 230a and the initial layer 230b includes a silicon oxide layer. The high-k dielectric layer 240 is disposed over the initial layers 230a and 230b. The high-k dielectric layer 240 may have a thickness ranging from about 10 angstroms to about 20 angstroms. In some embodiments, the high-k dielectric layer 140a may include a high-k dielectric such as hafnium oxide ($HfO_2$) hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or combinations thereof.

The TiN layer 242 overlies the high-k dielectric layer 240, and may have a thickness ranging from about 10 angstroms to about 30 angstroms. The TaN layer 244 overlies the TiN layer 242, and may have a thickness ranging from about 10 angstroms to about 30 angstroms. The TiN layer 246 overlies the TaN layer 244, and may have a thickness ranging from about 5 angstroms to about 20 angstroms. The TiN layer 242, and the TaN layer 244 are used to prevent impurities from entering underlying layers. In certain embodiments, only one or more of the TiN layer 242, and the TaN layer 244 is disposed over the high-k dielectric layer 240. It is noted that the sequence of the TiN layer 242, and the TaN layer 244 may be changed without affecting their purposes.

The TiAl layer 248 overlies the TiN layer 246 and the high-k dielectric layer 240, and may have a thickness ranging from about 30 angstroms to about 100 angstroms. The blocking metal layer 250 overlies the TiAl layer 248 for protecting the underlying layers, and may have a thickness ranging from about 10 angstroms to about 30 angstroms. The metal filler 260 fills a trench (not labeled) peripherally enclosed by the blocking metal layer 250, and may have a thickness ranging from about 1000 angstroms to about 5000 angstroms. The metal filler 260 can be configured to provide an electrical transmission. In some embodiments, the metal filler 260 may be formed from materials such as tungsten, copper or other suitable materials, and/or combinations thereof. A chemical mechanical polishing (CMP) operation is performed on the metal filler 260 shown in FIG. 2A until the gate spacers 222a and 222b are exposed, as shown in FIG. 2B. Therefore, a NMOS FinFET device (the source/drain portions 212a and 214a and the n-type gate structure 200a) and a PMOS FinFET device (the source/drain portions 212b and 214b together with the p-type gate structure 200b) can be simultaneously formed, thereby simplifying the fabrication process.

The TiAl layer 248 enclosed by the gate spacer 222a is a n-type work function metal layer, in which both surfaces of the n-type work function metal layer adjoin the TiN layer 246 and the blocking metal layer 250 respectively. From a result of EDS scan line, an atom ratio of Ti (titanium) to Al (aluminum) is in a range substantially from 1 to 3, and the both surfaces of the n-type work function metal layer contains an oxygen concentration substantially less than 10 atom percent (at %), and Al atom concentrations near or at the both surfaces of the n-type work function metal layer are higher than Al atom concentrations at other portions of the n-type work function metal layer, i.e. more Al segregation near or at the both surfaces of the n-type work function metal layer. The TiN layer 246 enclosed by the gate spacer 222b is a p-type work function metal layer, in which an atom ratio of Ti to N (nitrogen) is in a range substantially from 1:0.9 to 1:1.1, and the p-type work function metal layer contains an oxygen concentration substantially less than 10 atom percent (at %). According to the above EDS features, the work function metal layers with excellent properties can be provided.

Referring to FIG. 3A to FIG. 3G, FIG. 3A to FIG. 3G are schematic cross-sectional views of intermediate stages showing a method for fabricating a semiconductor device in accordance with some embodiments of the present disclosure.

Figure 3A:
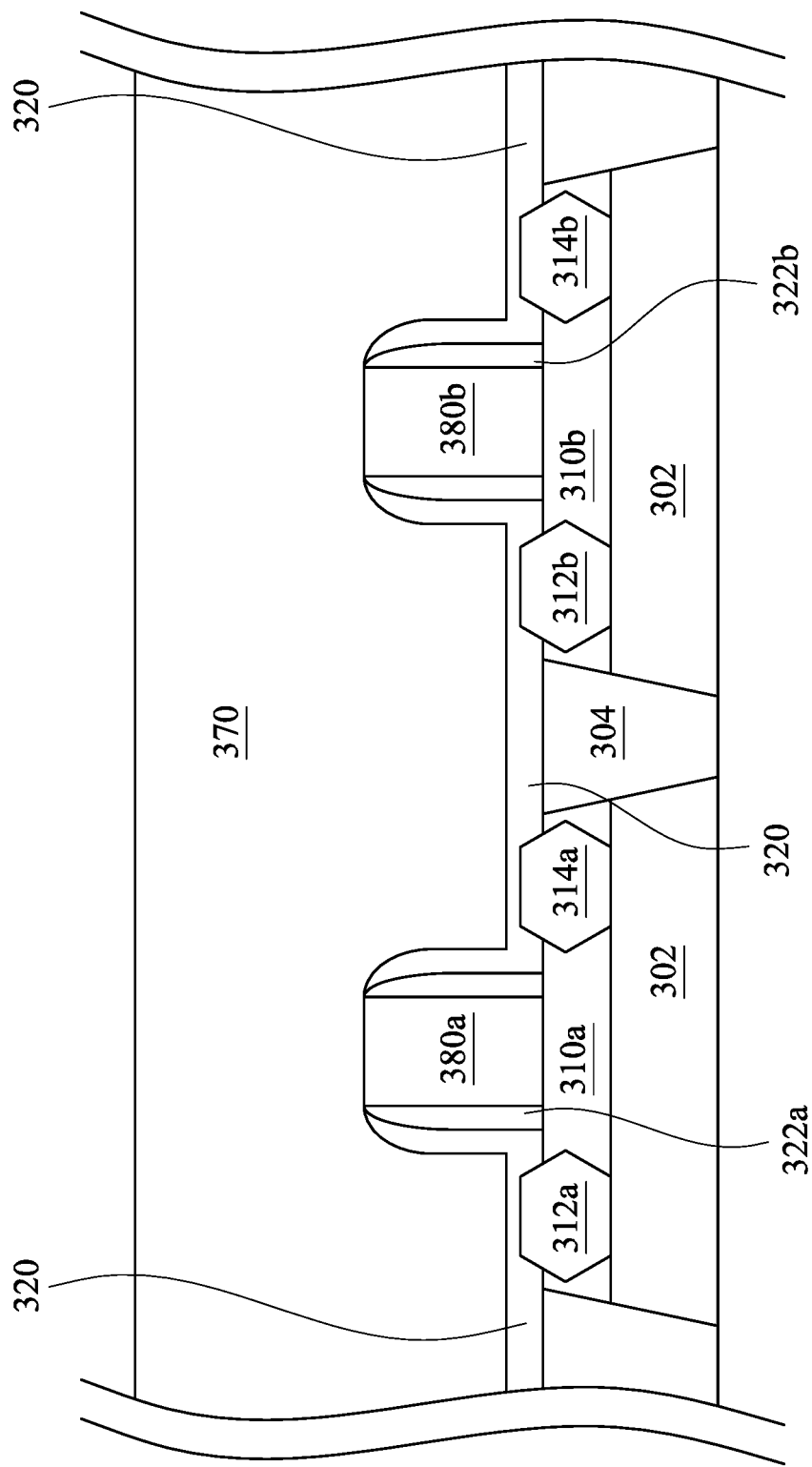
FIG. 3A to FIG. 3G are schematic cross-sectional views of intermediate stages showing a method for fabricating a semiconductor device in accordance with some embodiments of the present disclosure.

As shown in FIG. 3A, a semiconductor substrate 302 is provided, and is patterned and etched using a photolithography technique to form a semiconductor fin 310a and a semiconductor fin 310b which are separated by an isolation structure 304. The semiconductor substrate 310 is defined as any construction including semiconductor materials, including, but is not limited to, bulk silicon, a semiconductor wafer, or a silicon germanium substrate. Other semiconductor materials including group III, group IV, and group V elements may also be used. In some embodiments, a layer of photoresist material (not shown) is deposited over the semiconductor substrate 310, and is irradiated (exposed) in accordance with a desired pattern and developed to remove a portion of the photoresist material. The remaining photoresist material protects the underlying material from subsequent processing operation, such as etching. It should be noted that other masks, such as an oxide or silicon nitride mask, may also be used in the etching process. In other embodiments, the semiconductor fin 310a and the semiconductor fin 310b may be epitaxially grown. For example, exposed portions of an underlying material, such as an exposed portion of the semiconductor substrate 210, may be used in an epitaxial process to form the semiconductor fin 310a and the semiconductor fin 310b. A mask may be used to control the shape of the semiconductor fin 310a and the semiconductor fin 310b during the epitaxial growth process.

A poly gate 380a is formed on the semiconductor fin 310a, and a poly gate 380b is formed on the semiconductor fin 310b. A gate spacer 322a is formed on sidewalls of the poly gate 380a, and a gate spacer 322b is formed on sidewalls of the poly gate 380b. The gate spacer 322a, and the gate spacer 322b may include silicon oxide, silicon nitride, silicon oxynitride, or other dielectric material. Source/drain portions 312a and 314a are formed on the semiconductor fin 310a adjacent to both sides of the gate spacer 322a. Source/drain portions 312b and 314b are formed on the semiconductor fin 310b adjacent to both sides of the gate spacer 322b. In some examples, the source/drain portions 312a and 314a include SiP, and the source/drain portions 312b and 314b include SiGe. In some embodiments, an etching stop layer 320 is formed over the gate spacer 322a, the source/drain portions 312a and 314a, the isolation structure 304, the gate spacer 322b, and the source/drain portions 312b and 314b. An inter-layer dielectric (ILD) 370 is formed over the etching stop layer 320. The ILD 370 may include silicon oxide, phosphosilicate glass (PSG), borophosphosilicate glass (BPSG), and the like.

Figure 3B:
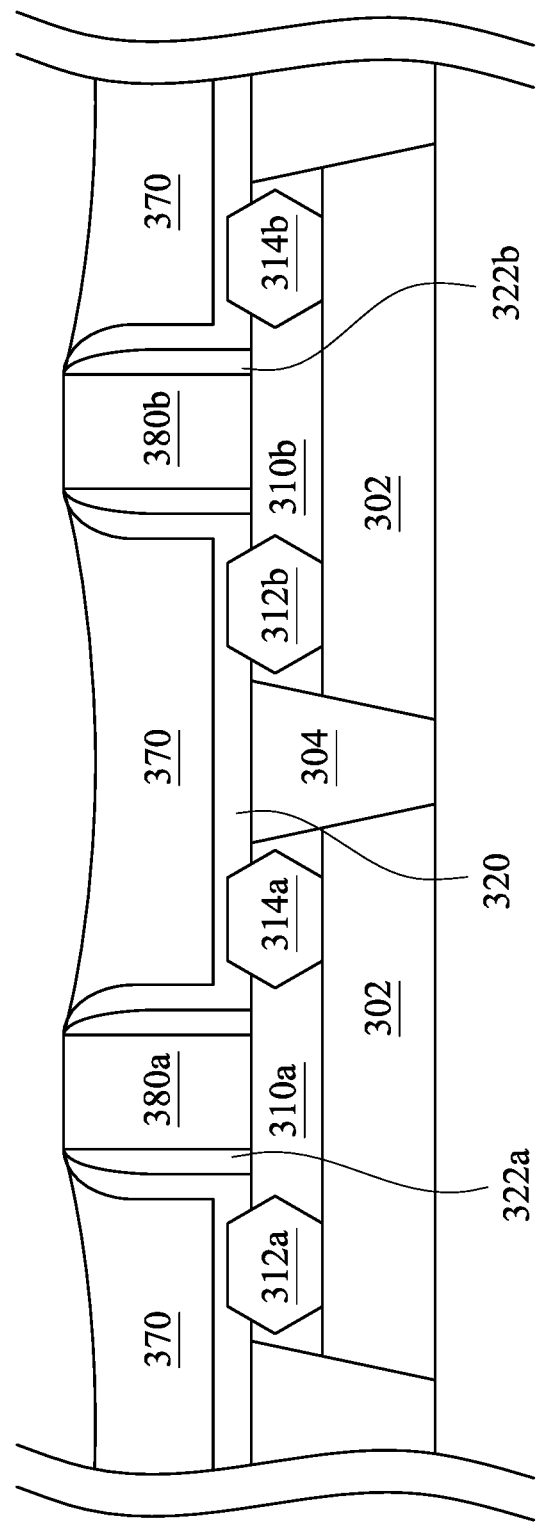
Figure 3C:
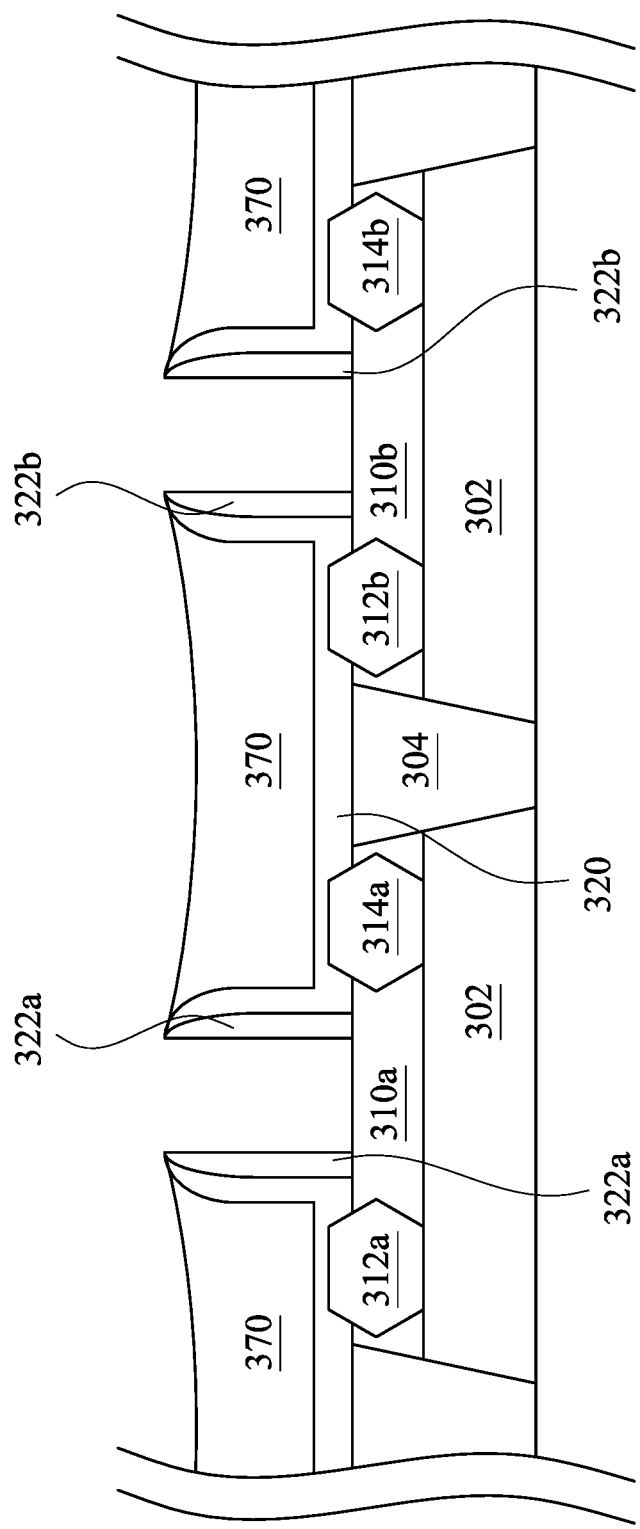
Figure 3D:
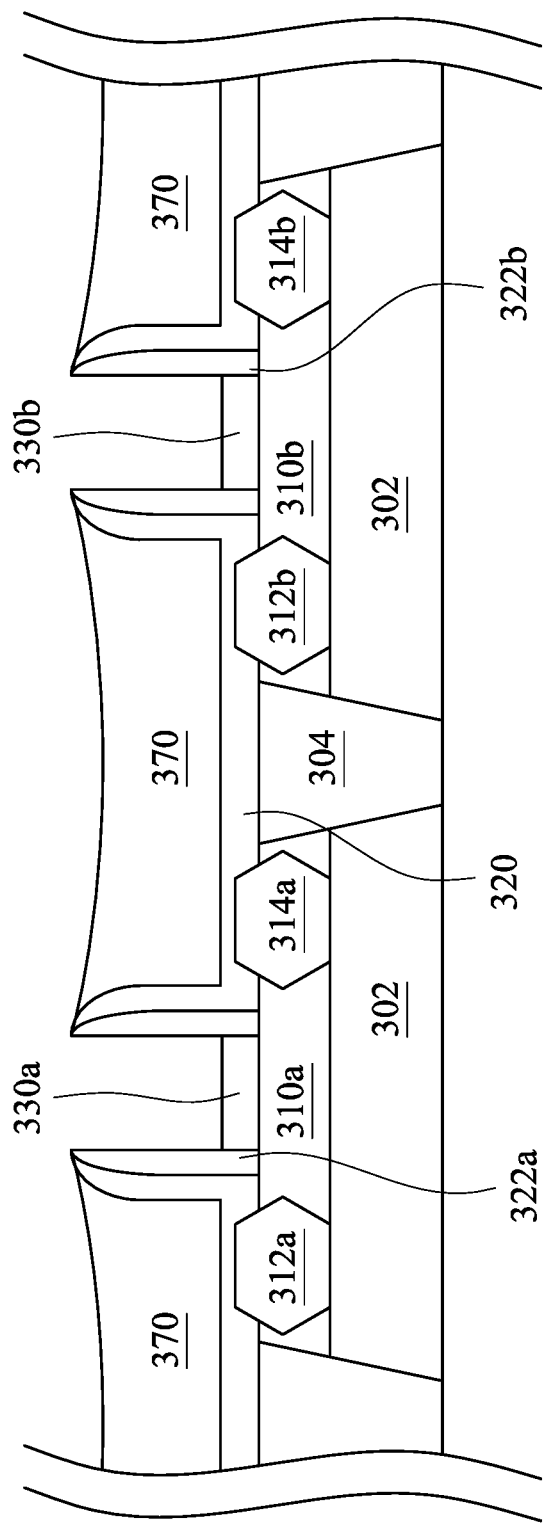

Thereafter, as shown in FIG. 3B, a portion of the ILD 370 is removed to expose the etching stop layer 320 by, for example, wet or dry etching. Then, as shown in FIG. 3C, the etching stop layer 320 and the poly gates 380a and 380b are removed by, for example, wet or dry etching. Thereafter, as shown in FIG. 3D, an initial layer 330a formed over the semiconductor fin 310a, and the initial layer 330b is formed over the semiconductor fin 310b. In some examples, each of the initial layer 330a and the initial layer 330b includes a silicon oxide layer, may be formed by using chemical vapor deposition (CVD), thermal oxide, ozone oxidation, other suitable processes.

Figure 3E:
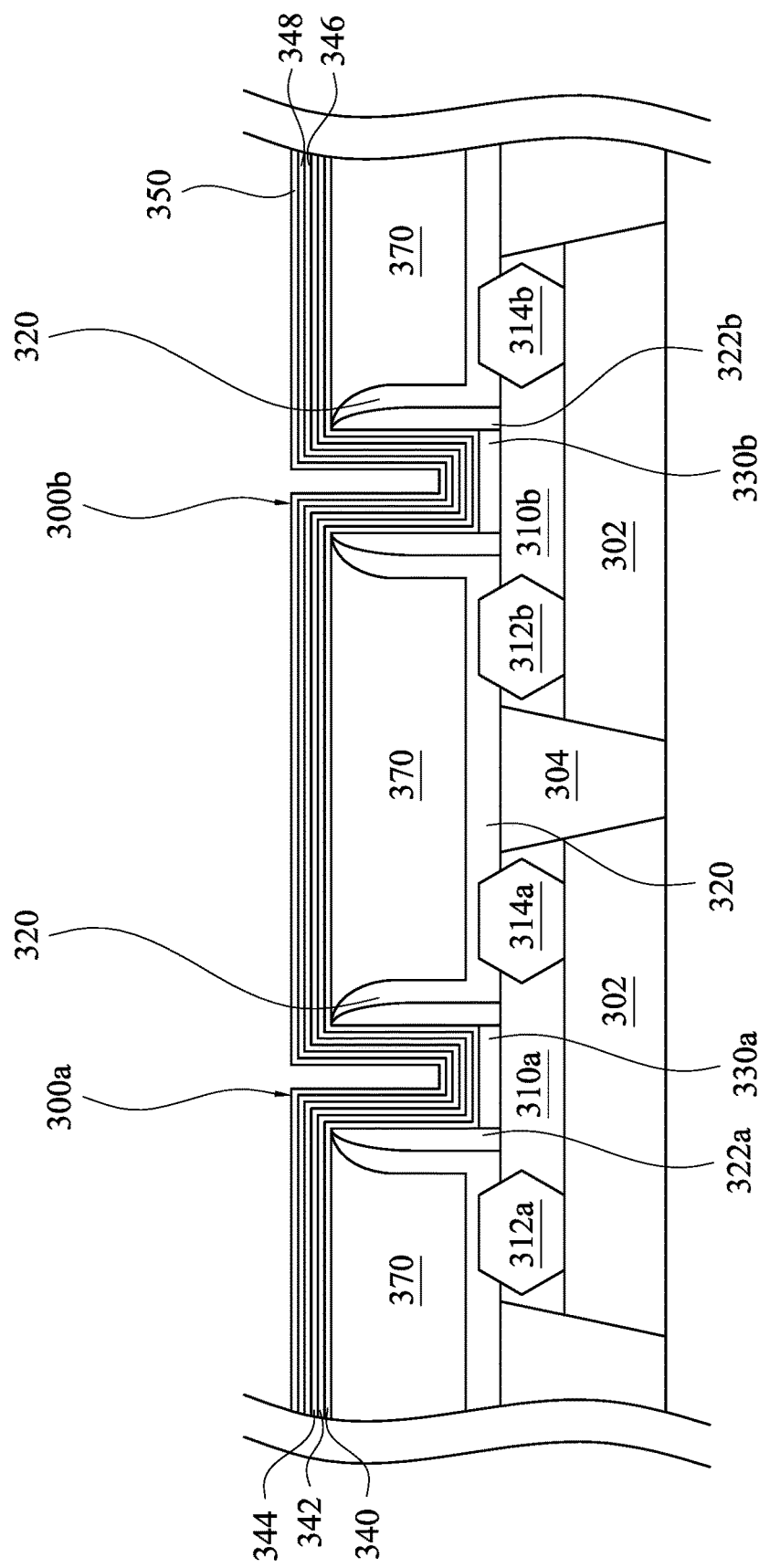

Then, as shown in FIG. 3E, a high-k dielectric layer 340 is formed over the initial layers 330a and 330b by using atomic layer deposition (ALD) or another suitable technique. The high-k dielectric layer 340 may have a thickness ranging from about 10 angstroms to about 20 angstroms. In some embodiments, the high-k dielectric layer 140a may include a high-k dielectric such as hafnium oxide ($HfO_2$) hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or combinations thereof.

A TiN layer 342 is formed over the high-k dielectric layer 340 by using ALD or another suitable technique, and may have a thickness ranging from about 10 angstroms to about 30 angstroms. A TaN layer 344 is formed over the TiN layer 342 by using ALD or another suitable technique, and may have a thickness ranging from about 10 angstroms to about 30 angstroms. A TiN layer 346 formed over the TaN layer 344 by using ALD or another suitable technique, and may have a thickness ranging from about 5 angstroms to about 20 angstroms. The TiN layer 342, and the TaN layer 344 are used to prevent impurities from entering underlying layers. In certain embodiments, only one or more of the TiN layer 342, and the TaN layer 344 is formed over the high-k dielectric layer 340. It is noted that the sequence of the TiN layer 342, and the TaN layer 344 may be changed without affecting their purposes. A TiAl layer 348 formed over the TiN layer 346 and the high-k dielectric layer 340 by using ALD or another suitable technique, and may have a thickness ranging from about 30 angstroms to about 100 angstroms. A blocking metal layer 350 formed over the TiAl layer 348 by using ALD or another suitable technique for protecting the underlying layers, and may have a thickness ranging from about 10 angstroms to about 30 angstroms.

Figure 3F:
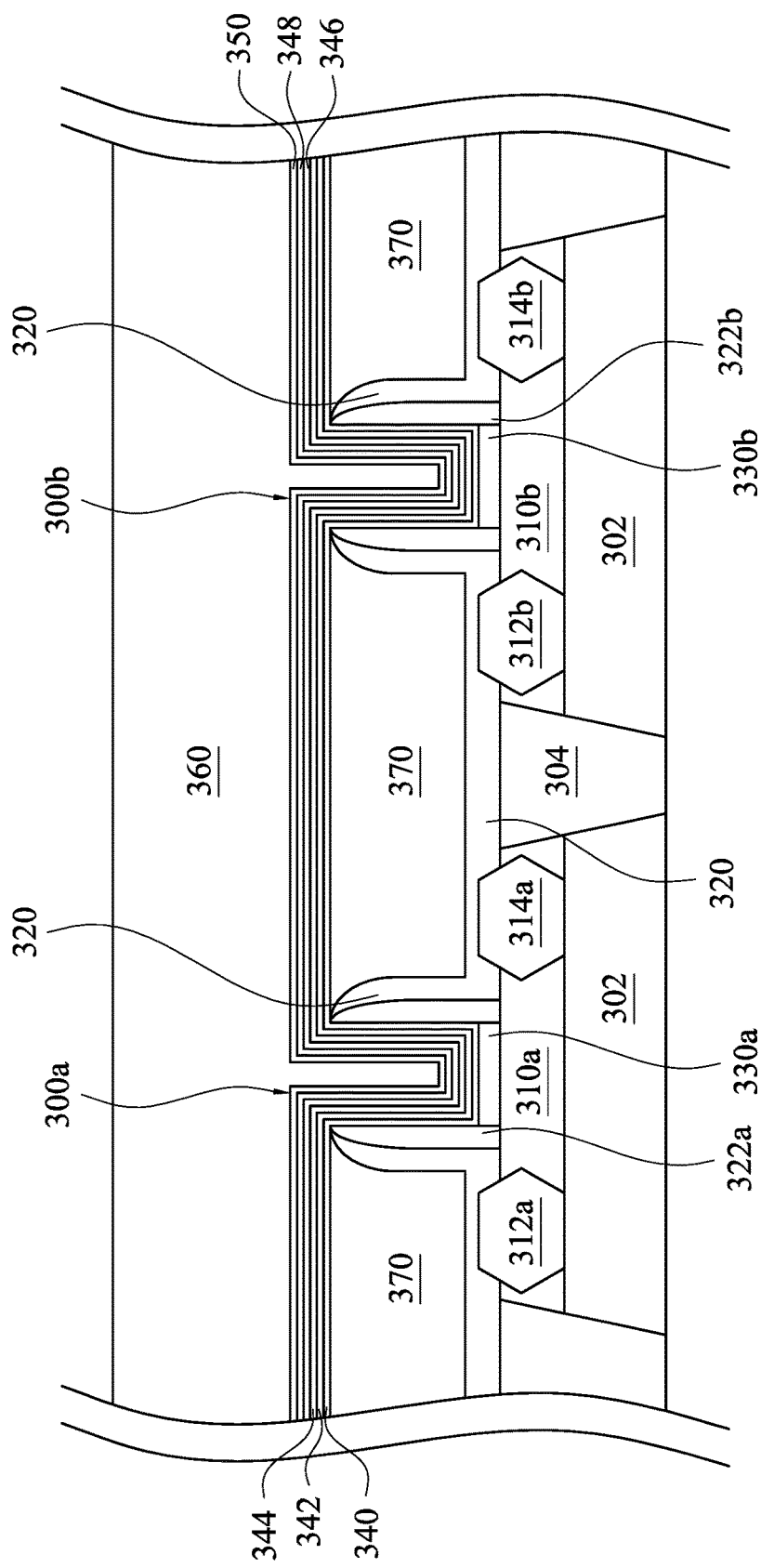

Then, as shown in FIG. 3F, a metal filler 360 fills a trench (not labeled) peripherally enclosed by the blocking metal layer 350 by using CVD, ALD or another suitable technique. The metal filler 360 can be configured to provide an electrical transmission. In some embodiments, the metal filler 360 may be formed from materials such as tungsten, copper or other suitable materials, and/or combinations thereof.

Figure 3G:
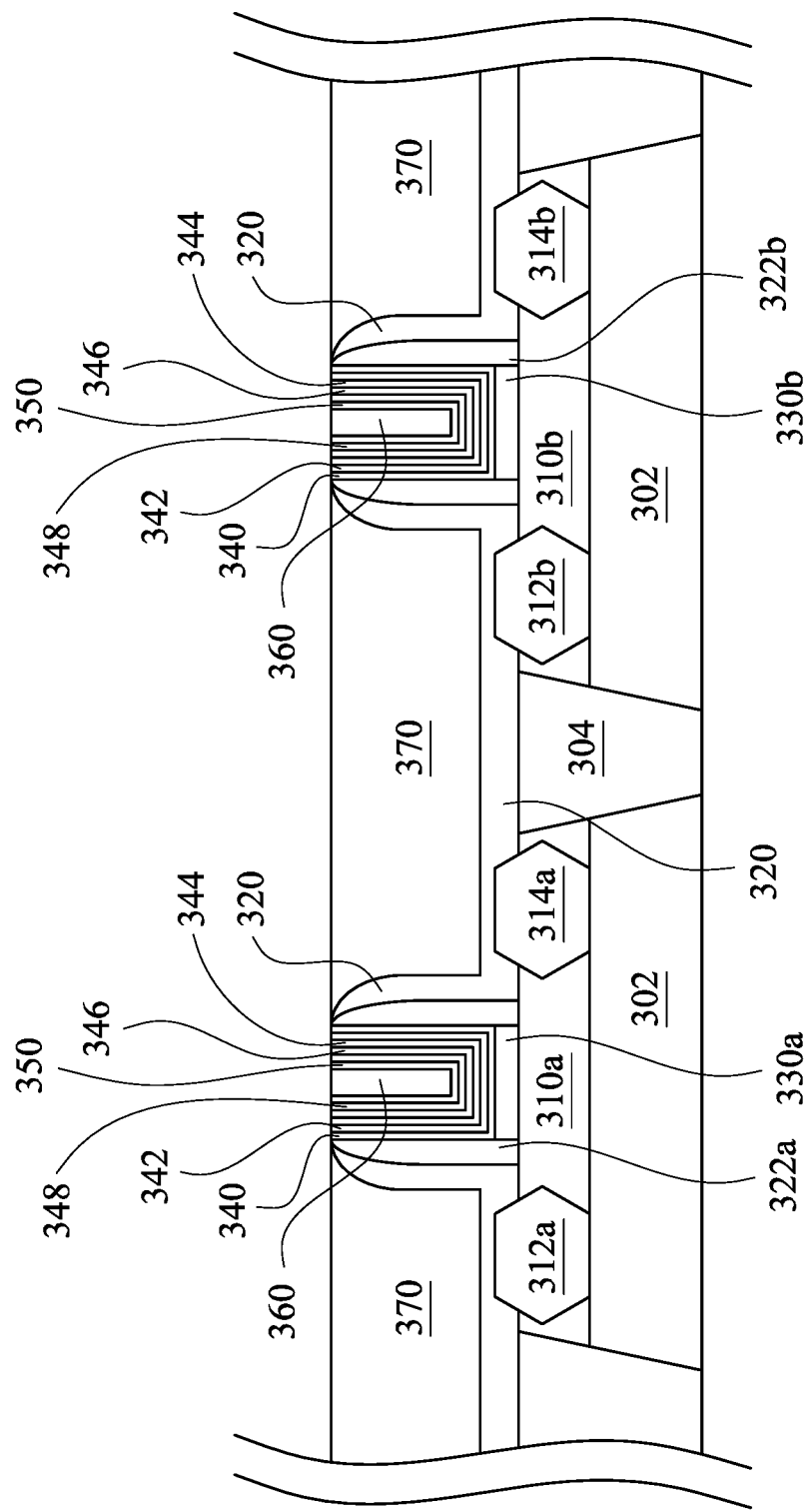

Thereafter, as shown in FIG. 3G, a chemical mechanical polishing (CMP) operation is performed on the metal filler 360 until the gate spacers 322a and 322b are exposed. The metal filler 360 may have a thickness ranging from about 1000 angstroms to about 5000 angstroms Therefore, a NMOS FinFET device (the source/drain portions 312a and 314a and the n-type gate structure enclosed by the gate spacer 322a) and a PMOS FinFET device (the source/drain portions 312b and 314b together and the p-type gate structure enclosed by the gate spacer 322a) can be simultaneously formed, thereby simplifying the fabrication process.

The TiAl layer 348 enclosed by the gate spacer 322a is a n-type work function metal layer, in which both surfaces of the n-type work function metal layer adjoin the TiN layer 346 and the blocking metal layer 350 respectively. From a result of EDS scan line, an atom ratio of Ti (titanium) to Al (aluminum) is in a range substantially from 1 to 3, and the both surfaces of the n-type work function metal layer contains an oxygen concentration substantially less than 10 atom percent (at %), and Al atom concentrations near or at the both surfaces of the TiAl layer 348 are higher than Al atom concentrations at other portions of the TiAl layer 348, i.e. more Al segregation near or at the both surfaces of the TiAl layer 348. The TiN layer 346 enclosed by the gate spacer 322b is a p-type work function metal layer, in which an atom ratio of Ti to N (nitrogen) is in a range substantially from 1:0.9 to 1:1.1, and the p-type work function metal layer contains an oxygen concentration substantially less than 10 atom percent (at %). According to the above EDS features, the work function metal layers with excellent properties can be provided.

Figure 4:
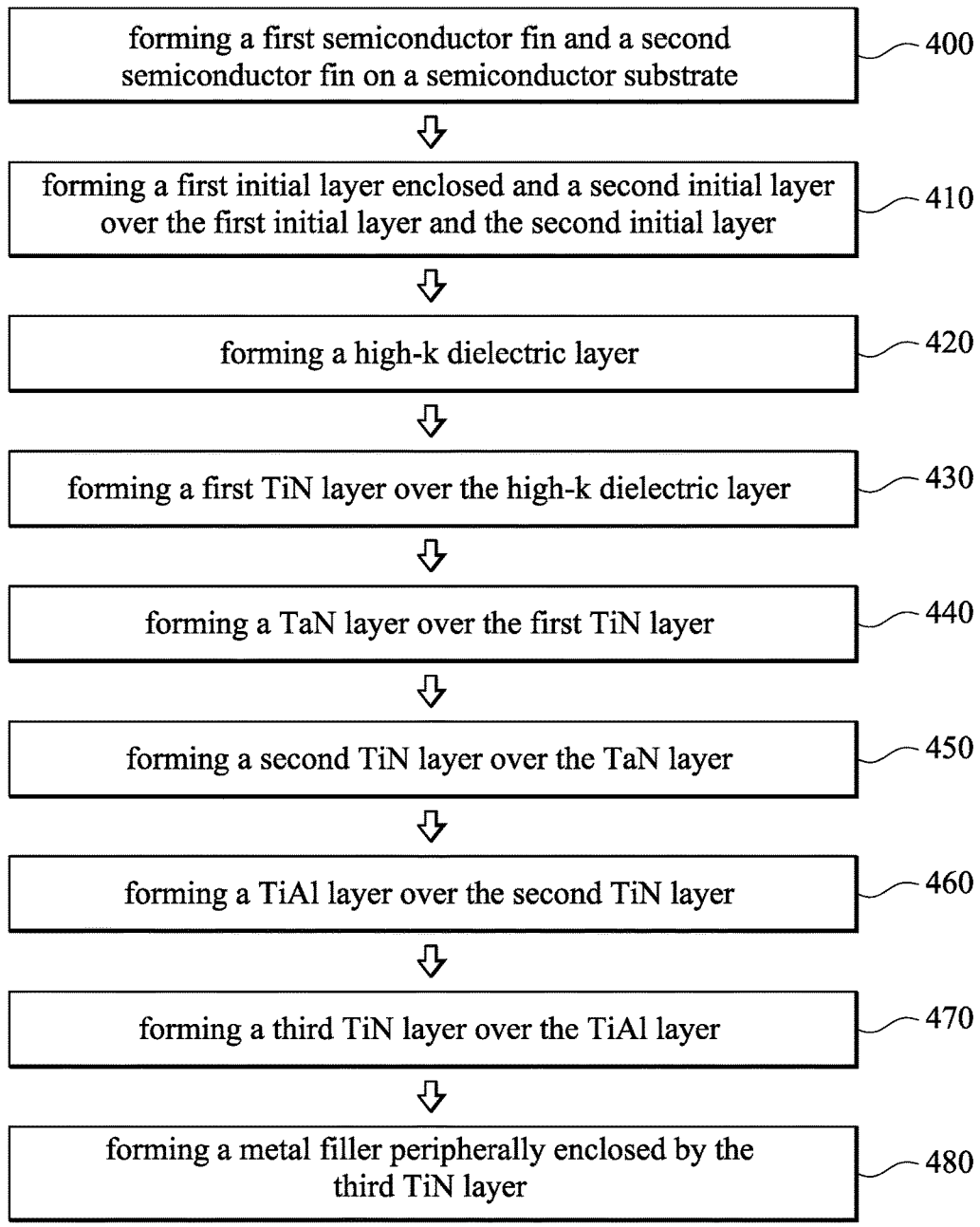
FIG. 4 is a flow chart showing a method for fabricating a semiconductor device in accordance with some embodiments of the present disclosure.

Referring to FIG. 4 and FIG. 3G, FIG. 4 is a flow chart showing a method for fabricating a semiconductor device in accordance with some embodiments of the present disclosure. The method begins at operation 400, in which a semiconductor fin 310a (first semiconductor fin) and a semiconductor fin 310b (second semiconductor fin) are formed on a semiconductor substrate 302, and are separated by an isolation structure 304. At operation 410, an initial layer 330a (first initial layer) enclosed by a gate spacer 322a (first gate spacer) is formed over the semiconductor fin 310a, and an initial layer 330b (second initial layer) enclosed by a gate spacer 322a (second gate spacer) is formed over the semiconductor fin 310b. At operation 420, a high-k dielectric layer 340 is formed over the initial layers 330a and 330b. At operation 430, a TiN layer 342 (first TiN layer) is formed over the high-k dielectric layer 320. At operation 440, a TaN layer 344 overlying the TiN layer 342. At operation 450, a TiN layer 346 (second TiN layer) is formed over the TaN layer 344. At operation 460, a TiAl layer 348 is formed over the TiN layer 346. At operation 470, a TiN layer 350 (third TiN layer) is formed over the TiAl layer 348. At operation 480, a metal filler 360 peripherally enclosed by the TiN layer 350 is formed. The TiAl layer 348 enclosed by the gate spacer 322a acts as a n-type work function metal layer, in which an atom ratio of Ti (titanium) to Al (aluminum) is in a range substantially from 1 to 3, and both surfaces of the n-type work function metal layer contains an oxygen concentration substantially less than 10 atom percent (at %), and Al atom concentrations near or at the both surfaces of the TiAl layer 348 are higher than Al atom concentrations at other portions of the TiAl layer 348, i.e. more Al segregation near or at the both surfaces of the TiAl layer 348. The TiN layer 346 enclosed by the gate spacer 322b acts as a p-type work function metal layer, wherein an atom ratio of Ti to N (nitrogen) is in a range substantially from 1:0.9 to 1:1.1, and the n-type work function metal layer contains an oxygen concentration substantially less than 10 atom percent (at %).

In accordance with some embodiments, a semiconductor device includes a semiconductor substrate; a first semiconductor fin on the semiconductor substrate; a n-type gate structure over the first semiconductor fin; a blocking metal layer overlying the n-type work function metal layer; and a first metal filler peripherally enclosed by the blocking metal layer. The blocking metal layer includes TiN (titanium nitride). The n-type gate structure includes a first initial layer over the first semiconductor fin; a first high-k dielectric layer over the first initial layer and enclosed by a first gate spacer; and a n-type work function metal layer overlying the first high-k dielectric layer, the n-type work function metal layer comprising a TiAl (titanium aluminum) alloy, in which an atom ratio of Ti (titanium) to Al (aluminum) is in a range substantially from 1 to 3.

In accordance with certain embodiments, a semiconductor device includes a semiconductor substrate; a first semiconductor fin and a second semiconductor fin on the semiconductor substrate; a n-type gate structure; and a p-type gate structure. The first semiconductor fin and the second semiconductor fin are separated by an isolation structure. The n-type gate structure includes a first initial layer over the first semiconductor fin and enclosed by a first gate spacer, and the p-type gate structure includes a second initial layer over the second semiconductor fin and enclosed by a second gate spacer. Each of the n-type gate structure and the p-type gate structure includes a high-k dielectric layer over the first initial layer and the second initial layer; a first TiN layer overlying the high-k dielectric layer; a TaN layer overlying the first TiN layer; a second TiN layer overlying the TaN layer; a TiAl layer overlying the second TiN layer; and a third TiN layer overlying the TiAl layer; and a metal filler peripherally enclosed by the third TiN layer. The TiAl layer enclosed by the first gate spacer is a n-type work function metal layer, in which an atom ratio of Ti (titanium) to Al (aluminum) is in a range substantially from 1 to 3. The second TiN layer enclosed by the second gate spacer is a p-type work function metal layer, in which an atom ratio of Ti to N (nitrogen) is in a range substantially from 1:0.9 to 1:1.1.

In accordance with some embodiments, a method includes forming a first semiconductor fin and a second semiconductor fin on a semiconductor substrate, in which the first semiconductor fin and the second semiconductor fin are separated by an isolation structure. A first initial layer enclosed by a first gate spacer over the first semiconductor fin is formed, and a second initial layer enclosed by a second gate spacer over the second semiconductor fin is formed. A high-k dielectric layer is formed over the first initial layer and the second initial layer. A first TiN layer is formed over the high-k dielectric layer. A TaN layer is formed over the first TiN layer. A second TiN layer is formed over the TaN layer. A TiAl layer is formed over the second TiN layer. A third TiN layer is formed over the TiAl layer. A metal filler peripherally enclosed by the third TiN layer is formed. The TiAl layer enclosed by the first gate spacer acts as a n-type work function metal layer, in which an atom ratio of Ti (titanium) to Al (aluminum) is in a range substantially from 1 to 3. The second TiN layer enclosed by the second gate spacer acts as a p-type work function metal layer, in which an atom ratio of Ti to N (nitrogen) is in a range substantially from 1:0.9 to 1:1.1.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate;
   a first semiconductor fin on the semiconductor substrate; and
   a n-type gate structure over the first semiconductor fin, the n-type gate structure comprising:
     a first initial layer over the first semiconductor fin;
     a first high-k dielectric layer over the first initial layer and enclosed by a first gate spacer;
     a n-type work function metal layer overlying the first high-k dielectric layer, the n-type work function metal layer comprising a TiAl (titanium aluminum) alloy, wherein an atom ratio of Ti (titanium) to Al (aluminum) is in a range substantially from 1 to 3, wherein both surfaces of the n-type work function metal layer contain an oxygen concentration substantially less than 10 atom percent (at %);
     a first blocking metal layer overlying the n-type work function metal layer; and
     a first metal filler peripherally enclosed by the first blocking metal layer.

2. The semiconductor device of claim 1, wherein the n-type gate structure further comprising:
   a capping metal layer between the first high-k dielectric layer and the n-type work function metal layer, wherein the capping metal layer comprises TiN.

3. The semiconductor device of claim 2, the n-type gate structure further comprising:
   a barrier metal layer between the capping metal layer and the n-type work function metal layer, the barrier metal layer comprising TaN (tantalum nitride); and
   a TiN layer between the barrier metal layer and the n-type work function metal layer.

4. The semiconductor device of claim 1, wherein Al atom concentrations near or at both of the surfaces of the n-type work function metal layer are higher than Al atom concentrations at other portions of the n-type work function metal layer.

5. The semiconductor device of claim 1, further comprising:
   a second semiconductor fin on the semiconductor substrate, wherein the first semiconductor fin and the second semiconductor fin are separated by an isolation structure; and
   a p-type gate structure over the second semiconductor fin, the p-type gate structure comprising:
     a second initial layer over the second semiconductor fin;
     a second high-k dielectric layer over the second initial layer and enclosed by a second gate spacer;
     a p-type work function metal layer overlying the second high-k dielectric layer, the p-type work function metal layer comprising titanium nitride (TiN), wherein an atom ratio of Ti to N (nitrogen) is in a range substantially from 1:0.9 to 1:1.1;
     a second blocking metal layer overlying the p-type work function metal layer; and
     a second metal filler peripherally enclosed by the second blocking metal layer.

6. The semiconductor device of claim 5, wherein the p-type work function metal layer contains an oxygen concentration substantially less than 10 atom percent (at %).

7. The semiconductor device of claim 5, the p-type gate structure further comprising a TiAl layer disposed between the p-type work function metal layer and the second blocking metal layer.

8. The semiconductor device of claim 5, the p-type gate structure further comprising:
   a capping metal layer between the first high-k dielectric layer and the p-type work function metal layer, wherein the capping metal layer comprises TiN.

9. The semiconductor device of claim 8, the p-type gate structure further comprising:
   a barrier metal layer between the capping metal layer and the p-type work function metal layer, wherein the barrier metal layer comprises TaN.

10. The semiconductor device of claim 5, wherein each of the first initial layer and the second initial layer comprise a silicon oxide layer.

11. A semiconductor device, comprising:
    a semiconductor substrate;
    a first semiconductor fin and a second semiconductor fin on the semiconductor substrate, wherein the first semiconductor fin and the second semiconductor fin are separated by an isolation structure; and
    a n-type gate structure comprising a first initial layer over the first semiconductor fin and enclosed by a first gate spacer, and a p-type gate structure comprising a second initial layer over the second semiconductor fin and enclosed by a second gate spacer, each of the n-type gate structure and the p-type gate structure comprising:
      a high-k dielectric layer over the first initial layer and the second initial layer;
      a first TiN layer overlying the high-k dielectric layer;
      a TaN layer overlying the first TiN layer;
      a second TiN layer overlying the TaN layer;
      a TiAl layer overlying the second TiN layer;
      a third TiN layer overlying the TiAl layer; and
      a metal filler peripherally enclosed by the third TiN layer;
    wherein the TiAl layer enclosed by the first gate spacer is a n-type work function metal layer, wherein an atom ratio of Ti (titanium) to Al (aluminum) is in a range substantially from 1 to 3; and
    the second TiN layer enclosed by the second gate spacer is a p-type work function metal layer, wherein an atom ratio of Ti to N (nitrogen) is in a range substantially from 1:0.9 to 1:1.1.

12. The semiconductor device of claim 11, wherein both surfaces of the n-type work function metal layer contain an oxygen concentration substantially less than 10 atom percent (at %).

13. The semiconductor device of claim 11, wherein the p-type work function metal layer contains an oxygen concentration substantially less than 10 atom percent (at %).

14. The semiconductor device of claim 11, wherein Al atom concentrations near or at both surfaces of the n-type work function metal layer are higher than Al atom concentrations at other portions of the n-type work function metal layer.

15. A method for forming a semiconductor device, the method comprising:
   forming a first semiconductor fin and a second semiconductor fin on a semiconductor substrate, wherein the first semiconductor fin and the second semiconductor fin are separated by an isolation structure;
   forming a first initial layer enclosed by a first gate spacer over the first semiconductor fin, and a second initial layer enclosed by a second gate spacer over the second semiconductor fin;
   forming a high-k dielectric layer over the first initial layer and the second initial layer;
   forming a first TiN layer over the high-k dielectric layer;
   forming a TaN layer over the first TiN layer;
   forming a second TiN layer over the TaN layer;
   forming a TiAl layer over the second TiN layer;
   forming a third TiN layer over the TiAl layer; and
   forming a metal filler peripherally enclosed by the third TiN layer;
   wherein the TiAl layer enclosed by the first gate spacer acts as a n-type work function metal layer, wherein an atom ratio of Ti (titanium) to Al (aluminum) is in a range substantially from 1 to 3; and
   the second TiN layer enclosed by the second gate spacer acts as a p-type work function metal layer, wherein an atom ratio of Ti to N (nitrogen) is in a range substantially from 1:0.9 to 1:1.1.

16. The method of claim 15, wherein operations of forming the first TiN layer, the second TiN layer, the third TiN layer, the TaN layer, the TiAl layer and the metal filler are performed by atomic layer deposition (ALD).

17. The method of claim 15, wherein both surfaces of then-type work function metal layer contain an oxygen concentration substantially less than 10 atom percent (at %), and Al atom concentrations near or at the both surfaces of the n-type work function metal layer are higher than Al atom concentrations at other portions of the n-type work function metal layer.

18. The method of claim 15, wherein the p-type work function metal layer contains an oxygen concentration substantially less than 10 atom percent (at %).

19. The method of claim 15, further comprising:
   forming source/drain portions respectively on the first semiconductor fin adjacent to both sides of the first gate spacer, and on the second semiconductor fin adjacent to both sides of the second gate spacer.

* * * * *

UNITED STATES PATENT AND TRADEMARK OFFICE
CERTIFICATE OF CORRECTION

| | | |
|---|---|---|
| PATENT NO. | : 9,620,610 B1 | Page 1 of 1 |
| APPLICATION NO. | : 14/983422 | |
| DATED | : April 11, 2017 | |
| INVENTOR(S) | : Shiu-Ko Jangjian et al. | |

It is certified that error appears in the above-identified patent and that said Letters Patent is hereby corrected as shown below:

In the Specification

Column 2, Line 66, please insert --first-- after the "a" and before "semiconductor fin 110a"

Column 9, Line 55, please delete "322a" and insert therefor --322b--

Column 10, Line 22, please delete "n-type" and insert therefor --p-type--

In the Claims

Column 14, Line 16, please delete "then-type" and insert therefor --the n-type--

Signed and Sealed this
Twelfth Day of September, 2017

Joseph Matal
*Performing the Functions and Duties of the*
*Under Secretary of Commerce for Intellectual Property and*
*Director of the United States Patent and Trademark Office*